United States Patent [19]
Doussiere

[11] Patent Number: 5,278,926
[45] Date of Patent: Jan. 11, 1994

[54] WIDENED OUTPUT MODE SEMICONDUCTOR OPTICAL COMPONENT AND METHOD OF FABRICATING IT

[75] Inventor: Pierre Doussiere, Saint Germain les-Arpajons, France

[73] Assignee: Alcatel Alsthom Compagnie Generale, France

[21] Appl. No.: 983,718

[22] Filed: Dec. 1, 1992

[30] Foreign Application Priority Data

Dec. 4, 1991 [FR] France .................... 91 15040

[51] Int. Cl.⁵ .............................. G02B 6/26
[52] U.S. Cl. ..................... 385/28; 156/630; 385/43; 385/50
[58] Field of Search ............. 385/1, 4, 15, 27, 28, 385/30, 39, 50, 43; 156/625, 629, 630, 631, 632, 633, 662, 663

[56] References Cited

U.S. PATENT DOCUMENTS

| | | | |
|---|---|---|---|
| 3,920,314 | 11/1975 | Yajima | 385/28 X |
| 3,978,426 | 8/1976 | Logan et al. | 372/45 |
| 3,980,392 | 9/1976 | Auracher | 385/28 X |
| 4,111,521 | 9/1978 | Streifer et al. | 372/50 |
| 4,159,452 | 6/1979 | Logan et al. | 385/43 X |
| 4,773,720 | 9/1988 | Hammer | 385/131 |
| 5,078,516 | 1/1992 | Kapon et al. | 385/43 X |
| 5,131,060 | 7/1992 | Sakata | 385/28 X |

FOREIGN PATENT DOCUMENTS

4010823 10/1991 Fed. Rep. of Germany.
55-62408 5/1980 Japan ....................... 385/28

OTHER PUBLICATIONS

Milton et al, "Tapered Velocity Couplers for Integrated Optics: Design," *Applied Optics*, vol. 14, No. 5, May 1975, pp. 1207–1212.
Burns et al, "Optical Modal Evolution 3-dB Coupler," *Applied Optics*, vol. 15, No. 4, Apr., 1976, pp. 1053–1064.
Patent Abstracts of Japan, vol. 7, No. 222 (E-201)(1367) Oct. 4, 1983 & JP-A-58 114 476 (Kokusai Denshin).

*Primary Examiner*—John D. Lee
*Attorney, Agent, or Firm*—Sughrue, Mion, Zinn, Macpeak & Seas

[57] ABSTRACT

A widened output mode semiconductor optical component such as a laser includes superposed active and passive waveguides. The width of the active waveguide decreases in a rear part of a mode transition section to couple a "narrow" optical mode which is amplified and guided by the active waveguide to a "wide" mode which is guided by the passive waveguide and which has a mode size greater than that of the narrow mode. The width of the passive waveguide then decreases in a front part of this section to couple the wide mode to an even wider circular mode. The invention finds applications in the fabrication of optical heads for optical fiber telecommunication networks.

12 Claims, 7 Drawing Sheets

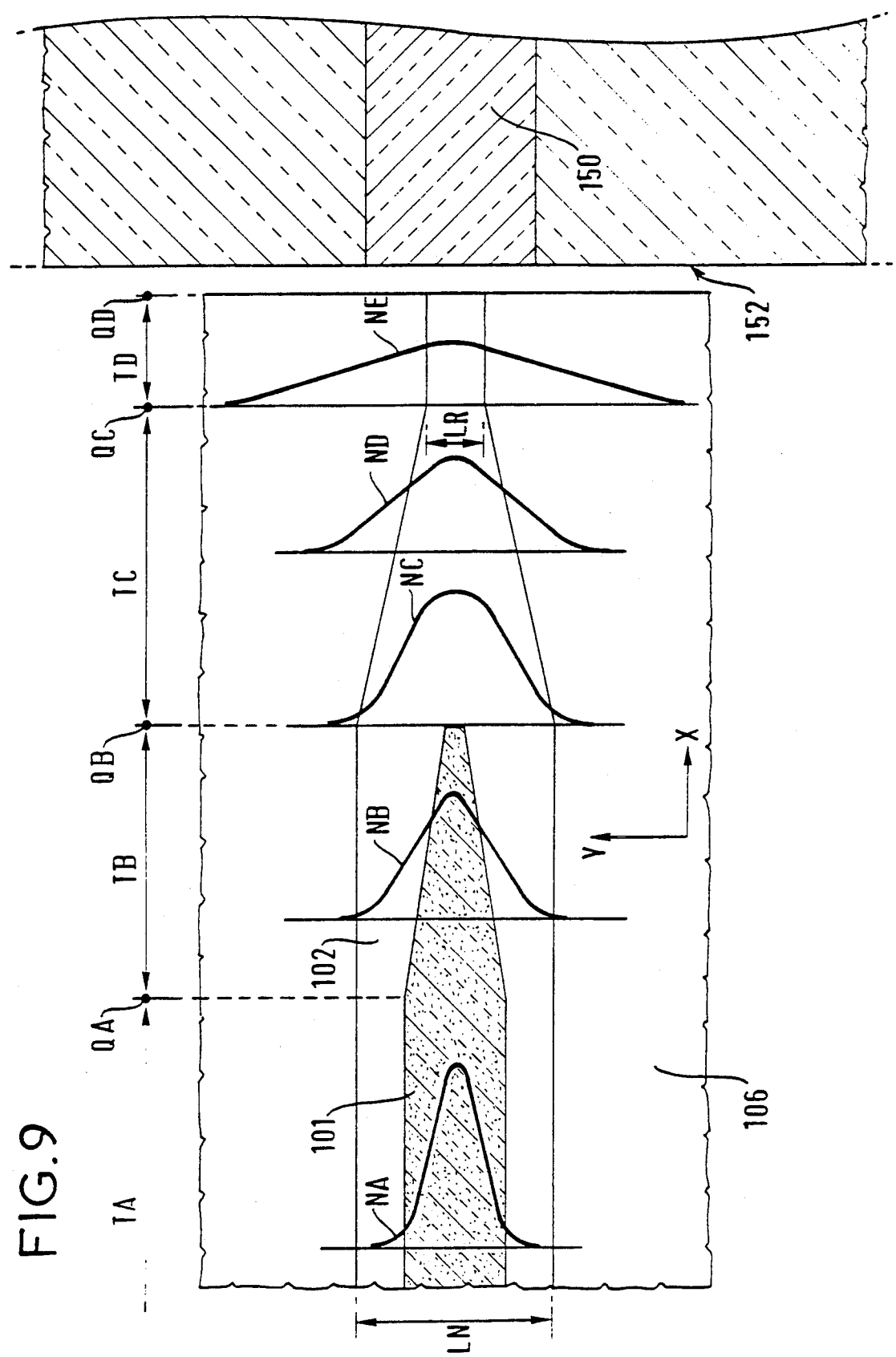

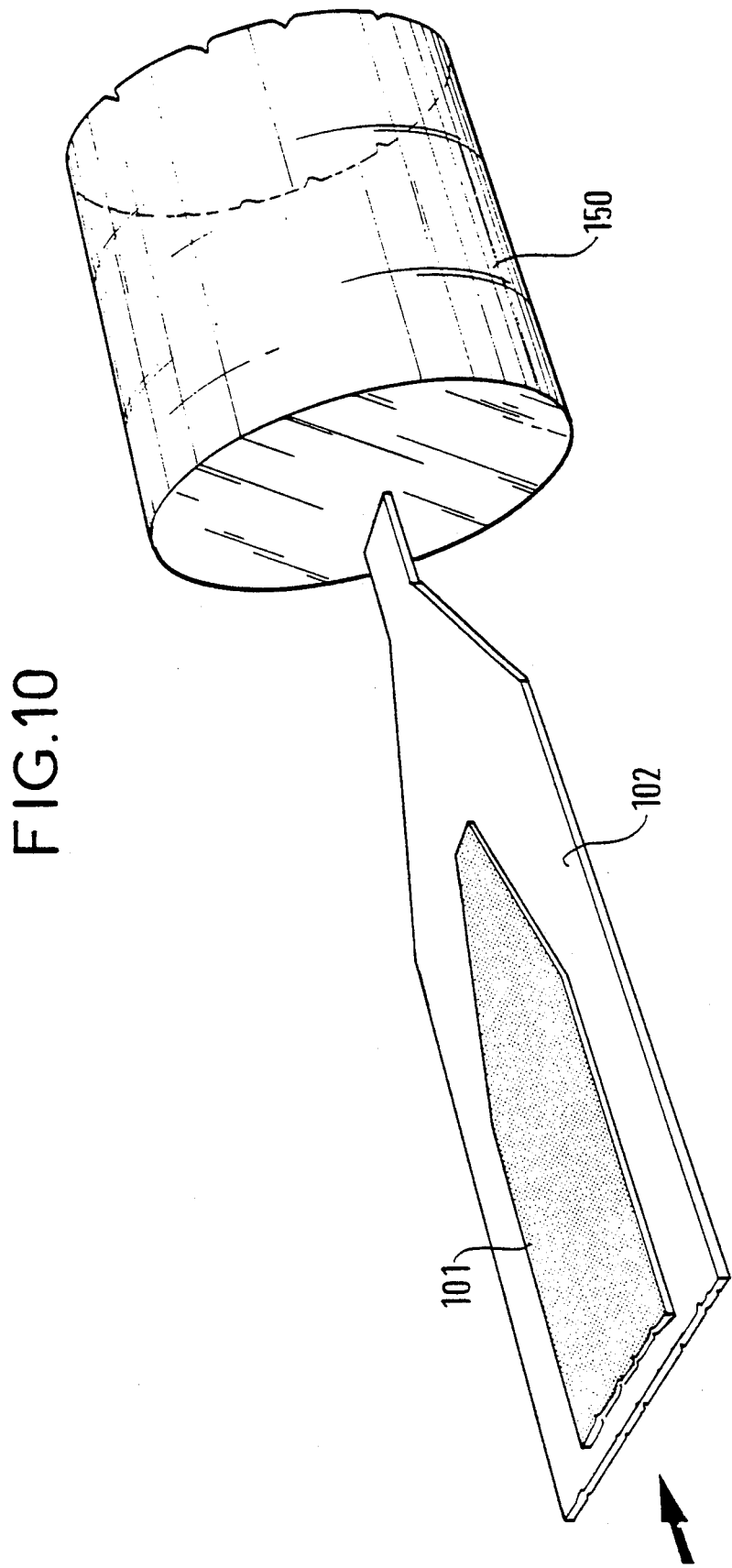

WIDENED OUTPUT MODE SEMICONDUCTOR OPTICAL COMPONENT AND METHOD OF FABRICATING IT

BACKGROUND OF THE INVENTION

1. Field of the Invention

The present invention concerns the implementation of a semiconductor optical component and interfacing it to an external optical element. It is more specifically directed to solving a known problem which is to obtain two results simultaneously. A first result to be obtained is to "process" light efficiently in the optical component in question, the term "process" here referring to such actions as emitting, amplifying, detecting or modulating the light. Reference will often be made hereinafter, by way of non-limiting example only and with a view to facilitating an understanding of the present invention, to an optical component in which the light is processed in the form of a laser. The light to be processed is then in the form of a wave guided in the laser in a so-called narrow mode whose mode size may be limited by considerations concerning the required efficiency and the internal operation of the laser. The second result to be achieved is that the light processed in this way is supplied to said external optical element or can be received efficiently from said element in the form of a wide guided mode whose mode size is greater than that of said narrow mode. A wide mode of this kind typically has the advantage of enabling easier and more efficient coupling of this wave to an optical fiber which receives or supplies the light processed or to be processed.

2. Description of the Prior Art

A first known solution to this problem is described in "Tapered waveguide InGaAs/InGaAsp multiple quantum well lasers" by T. L. KOCH, U. KOREN, G EISENSTEIN, M. G. YOUNG, M. ORON, C. R. GILES and B. I. MILLER, IEEE Photonics technology letters, Vol. 2, No 2, February 1990, page 88.

This document describes a semiconductor laser emitting a wide guided mode. This laser is complex to implement.

A second known solution to this problem is described in "Efficient coupling of a semiconductor laser to an optical fiber by means of a tapered waveguide on silicon" by Y. SHANI, C. H. HENRY, R. C. KISTLER, K. J. ORLOWSKY and D. A. ACKERMAN, Appl. Phys. lett. 55, December 1989, page 2389.

This document describes a coupling device which receives a narrow mode at the output of a semiconductor laser and transmits a wide mode facilitating coupling to an optical fiber.

The insertion of a device of this kind complicates the implementation of an optical head which must couple the laser to the optical fiber in a limited space. It is also difficult to position the coupling device relative to the laser.

One object of the present invention is to propose a solution to this problem which is simple to implement, requires only a limited space and results in only low losses of light.

SUMMARY OF THE INVENTION

A component in accordance with the invention comprises two optical waveguides, an active waveguide and a passive waveguide, superposed over at least part of their lengths, the transverse cross-section area of the active waveguide decreasing in a mode transition section to couple a "narrow" optical mode which is processed and guided by the active waveguide to a "wide" mode which is guided by the passive waveguide and which has a mode size greater than that of the narrow mode. According to the invention the decrease in the cross-section area results at least partially from the fact that the width of the active waveguide decreases in the mode transition section.

How the present invention may be put into effect will now be described with reference to the appended diagrammatic drawings. It is to be understood that the elements and arrangements described and shown are described and shown by way of non-limiting example only. If the same element is shown in more than one figure it is always identified by the same reference symbol.

BRIEF DESCRIPTION OF THE DRAWINGS

FIG. 9 shows the second laser in partial cross-section on a horizontal plane IX—IX in FIG. 7.

FIG. 10 is a partial perspective view of the second laser.

DETAILED DESCRIPTION OF THE INVENTION

Figure 1:
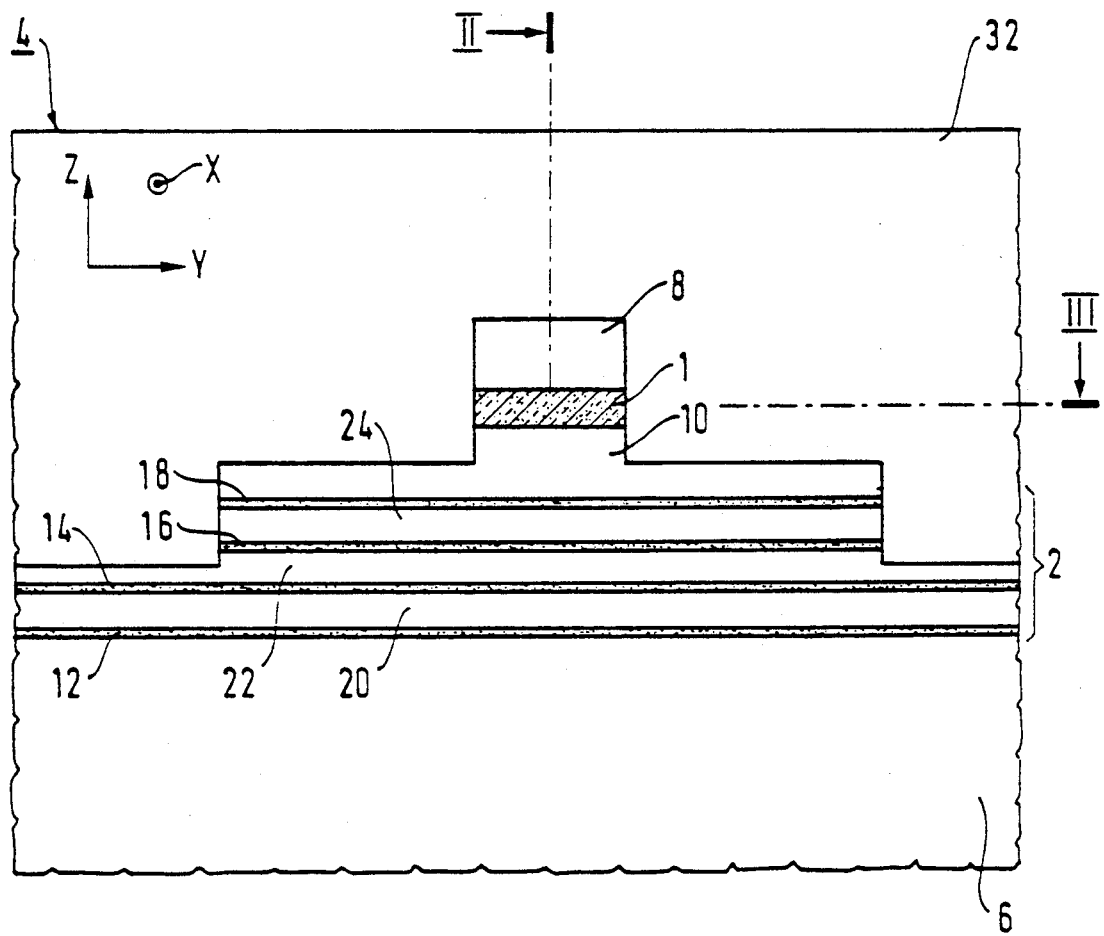
FIG. 1 shows a first laser in accordance with the present invention in cross-section on a transverse plane I—I in FIG. 2.

To describe how this invention may be put into effect the terminology employed will first be explained in the case of the first laser in accordance with the invention and with reference to FIGS. 1 and 2, these definitions assuming a horizontal semiconductor wafer 4. The wafer defines a longitudinal direction X and a transverse direction Y. Horizontal planes contain these two directions. Transverse planes are perpendicular to the longitudinal direction. The wafer also defines a vertical direction Z perpendicular to these horizontal planes. Lengths, widths, thicknesses and transverse cross-section areas of elements internal to the wafer are measured in these longitudinal, transverse and vertical directions and in these transverse planes, respectively.

The wafer comprises three successive longitudinal sections SA, SB, SC (FIG. 2) in longitudinal sequence which constitute at least one processing section SA and one mode transition section SB. In this example where the wafer constitutes a laser, the processing section SA is specifically an amplifier section. This section starts at an initial transition point PA near the amplifier section and ends at a wide mode point PB which in the first laser also constitutes a final transition point at a distance from this section. A third section of the first laser constitutes a coupling section SC from which the laser may be coupled to an optical fiber.

By virtue of arrangements known in themselves two longitudinal end faces (not shown) of the wafer may constitute reflectors to implement a laser. They could instead be treated to prevent reflection of light and constitute a laser amplifier which would be coupled to input and output optical fibers and which would comprise two mode transition sections and two coupling sections, one on each side of the amplifier section.

There now follows a general description of certain arrangements adopted in the lasers described by way of example and which they share, in respect of the functions mentioned, with the laser disclosed in the aforementioned Koch document.

Referring to these common arrangements, the wafer 4 comprises a vertical succession of horizontal functional layers which constitute at least the following elements:

A lower confinement layer 6 having a first conductivity type.

A longitudinal passive waveguide 2 flanked in the transverse direction by a complementary material 32. To enable it to guide optical waves, this waveguide has an "increased" refractive index, that is to say a refractive index which is greater than the refractive indices of the surrounding materials. This index, a normal width and a thickness of this waveguide are selected to guide light in a single "wide" mode MC.

A longitudinal active waveguide 1 flanked in the transverse direction by a complementary material 32. This waveguide is made from an active material which has an increased refractive index to guide said light and which is adapted to process the light by interacting with opposite type charge carriers and specifically to amplify the light by virtue of combination of such carriers. The active waveguide comprises a single semiconductor layer but could instead comprise a vertical succession of layers of different composition. The passive and active waveguides are superposed. Their widths, thicknesses, refractive indices and separation are chosen to obtain mutual optical coupling between the waveguides in the amplifier section SA and the mode transition section SB and so that light is guided by the combination of the waveguides in the amplifier section in a single mode which concentrates the energy of the light in the active waveguide to favor its amplification. This single mode is a narrow mode the mode size of which is less than that of said wide mode MC. The width and the thickness of the active waveguide 1 in the amplifier section SA define a processing transverse cross-section area. In the mode transition section SB and starting from the initial transition point PA the transverse cross-section of the waveguide decreases progressively from the processing transverse cross-section area so that the light which is guided in the vicinity of this point in the narrow mode is guided by the passive waveguide in the wide mode MC in the vicinity of the wide mode point PB. The passive waveguide 2 has constant properties in the amplifier sections and at least as far as the wide mode point. In the first laser it has the same properties over all the length of the wafer 4.

Propagation of light in the narrow mode enables efficient amplification which may be relatively insensitive to its polarization in the amplifier section. The wide mode facilitates coupling to the optical fiber.

The wafer 4 further essentially comprises an upper confinement layer 8 having a second conductivity type opposite the first conductivity type so that the passage of an electric energization current in a forward direction between the lower and upper confinement layers is accompanied by injection of said opposite type charge carriers into the active waveguide 1 in the amplifier section SA.

It will be understood that the complementary material 32 comprises various well-known layers which are beneficial to the operation of the laser and which are not shown. These include lateral optical and electrical confinement layers, contact layers, etc. Also, the wafer is provided with electrodes (not shown) for injecting the energization electric current.

Others of the aforementioned common arrangements will now be described in more detail.

In the amplifier section SA or at least at the initial transition point the passive waveguide has a so-called "normal" width which is greater than or equal to the width of the active waveguide 1. It also has a thickness greater than or equal to the thickness of the active waveguide and a mean refractive index which is less than the refractive index of the waveguide. To be more precise, the mean refractive index of the passive waveguide is made sufficiently close to that of the surrounding material for the narrow mode to be guided essentially by the active waveguide in the section SA.

The wide mode point PB constitutes one end of the active waveguide 1.

The wide mode MC has transverse and vertical mode sizes 200% and preferably 400% greater than the transverse and vertical mode sizes of the narrow mode MA. These mode sizes of each of these modes are conventionally defined as the transverse and vertical dimensions of the area in which the electric field of the mode is attenuated in a ratio less than 2.718 relative to the maximal electric field of the mode.

In the laser disclosed in the KOCH document the decrease in the transverse cross-section area of the active waveguide in the mode transition section is achieved by a longitudinal succession of sudden reductions in the waveguide thickness. This arrangement has drawbacks: it causes losses of light and its implementation requires a succession of costly etching steps.

The present invention provides a very simple way of totally eliminating these drawbacks because the active waveguide 1 can have a constant thickness in the mode transition section SB, the decrease in its transverse cross-section being obtained exclusively because its width decreases progressively from the initial transition point PA to the wide mode point PB. As an alternative to this, the transverse cross-section could be reduced by reducing the width and reducing the thickness, although this would avoid said drawbacks only partially.

A separation layer 10 is preferably disposed between the active waveguide 1 and the passive waveguide 2. It has a refractive index which is lower than the mean refractive index of each of the two waveguides. Its thickness constitutes a separation thickness which is made relatively large to enable the active waveguide to be delimited in the transverse direction, that is to say to enable its width to be defined, by an etching operation without risk of this etching operation reaching the passive waveguide which must be wider in the transition section for reasons that will emerge later. The thickness is made sufficiently small to maintain the required optical coupling between the active and passive waveguides.

In the mode transition section SB the general shape of the active waveguide 1 projected onto a horizontal plane is of an arrow head with the pointed end cut off, in other words its width reduces progressively to a final width which is sufficiently small for its effect on the light propagation mode to be negligible in comparison with that of the waveguide 2. This effect is shown in FIGS. 2 and 3 which are very approximate representations of the energy distribution of the narrow mode MA, an intermediate distribution MB and the distribution of the wide mode MC. Each of these distributions is represented by two diagrams, one in FIG. 2 and the other in FIG. 3. Each of these diagrams comprises a curve and a reference axis. The reference axis represents a line in a transverse vertical plane passing through the wafer 4, the line passing through the point in this plane at which the value of the alternating electric field of the guided optical mode is maximal. The value of the electric field is determined at each point on this line and the square of this value is plotted parallel to the longitudinal direction X to obtain a point on the curve in this diagram. These diagrams therefore represents these modes by showing the distribution of their electric fields.

These diagrams show that the decrease in the width of the waveguide 1 reduces the confinement of the guided mode in the waveguide 1 together with a progressive "sliding" of this mode towards the waveguide 2. This movement is accompanied by expansion due to the lower mean refractive index of the waveguide 2. The length of the decreasing width area must be sufficient for the transition losses to be as low as is required (from 50 to 200 micrometers in the case of a wavelength in the order of 0.8 to 1.6 micrometer).

The fact that the two waveguides are superposed makes the present invention particularly well suited to implementation by the usual epitaxial growth techniques. It then becomes possible to implement active optical components in which the mode is transferred from a strongly guided (index step at least $10^{-1}$) active waveguide (waveguide 1) to a weakly guided (index step at most $10^{-2}$) passive waveguide (waveguide 2) via a continuous adiabatic transition section on the same substrate producing low losses.

Reducing the lateral width of the waveguide 1 means that the transition section and the active waveguide can be implemented in a single masking and etching step. This choice combines this advantage with those of solutions previously proposed but until now requiring multiple masking steps (KOCH document) or enabling implementation only of passive components (SHANI document).

The present invention can therefore find significant applications in the implementation of active semiconductor opto-electric components for monomode optical fiber transmission systems. Such components may constitute emitters, amplifiers and modulators. They are referred to generically herein by the term "laser".

In the first laser in accordance with the present invention the passive waveguide 2 comprises a vertical succession of index increasing layers 12, 14, 16, 18 and index decreasing layers 20, 22, 24. The index increasing layers have refractive indices higher than the index decreasing layers so that the passive waveguide 2 has a mean refractive index between those of the index increasing and index decreasing layers.

The second laser described as one example of the present invention is generally identical to the first. It therefore comprises elements implementing the same functions, referred to by the same terminology, and any information given hereinabove remains valid unless otherwise indicated. If an element of the second laser has the same function as an element of the first layer it is identified hereinafter by the same reference number increased by 100.

As compared with the first laser the second laser is generally characterized by the fact that the width of the active waveguide 101 decreases towards the front in a rear part TB only of the mode transition section and in that the width of the passive waveguide 102 decreases towards the front in a front part TC of this section so as to couple said wide mode to a circular mode NE of even greater mode size.

To be more precise, the transition section TB, TC comprises successive rear and front parts constituting a first transition TB and a second transition TC. The first transition TB extends from the initial transition point QA to said wide mode point QB, the width of said active waveguide 101 decreasing towards the front in this first transition. The second transition extends longitudinally towards the front from the wide mode point QB to said transition terminal point or transition final point QC, the width of said passive waveguide 102 decreasing towards the front in this second transition so that the light guided by the passive waveguide in said wide mode in the vicinity of the wide mode point is guided by the same waveguide in a circular mode NE in the vicinity of the terminal transition point QC. The circular mode has horizontal and vertical mode sizes increased relatively to the wide mode, the vertical mode size being increased in a ratio greater than that in which the horizontal mode size is increased.

In a preferred arrangement, in the second transition TC the width of the passive waveguide 202 is first equal to a normal passive waveguide width LN measured at the wide mode point QB and then decreases progressively to the transition terminal point QC where it is equal to a reduced passive waveguide width LR. In the laser described here by way of example the width then remains equal to the reduced width in a coupling section TD extending towards the front from the transition section to an end QD of the laser. The thickness of the waveguide is constant. The active waveguide is no longer present from the wide mode point QB.

The reduced width LR is preferably less than 60% and for example equal to 40% of the normal width LN of the passive waveguide 102. The passive waveguide 102 comprises a single index increasing layer. Its thickness may then be less than that of the active waveguide 101.

Figure 8:
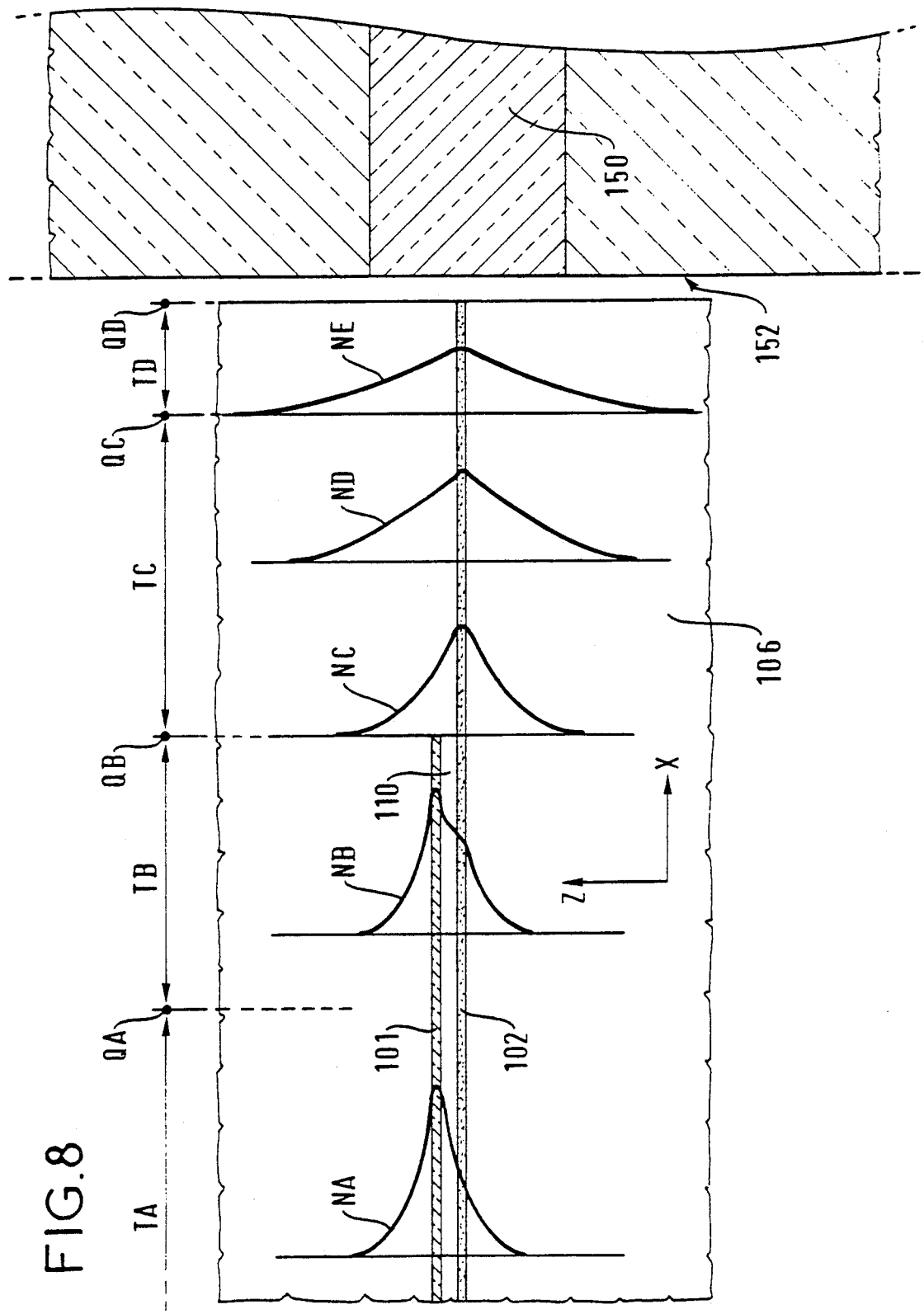
FIG. 8 shows the second laser in accordance with the invention in partial cross-section on a longitudinal plane VIII—VIII in FIG. 7.

FIGS. 8 through 10 show the core 150 of a monomode optical fiber 152 into which the circular mode is injected.

The active waveguide 101 has a width of 2 000 nm and a thickness of 100 nm in the processing section TA, for example.

Its final width at the wide mode point NC is 400 nm, for example, the length of the rear transition TB being 0.1 mm. The passive waveguide 102 has a reduced width LR of 2 000 nm, for example, the length of the front transition TC being 0.1 mm.

Figure 2:
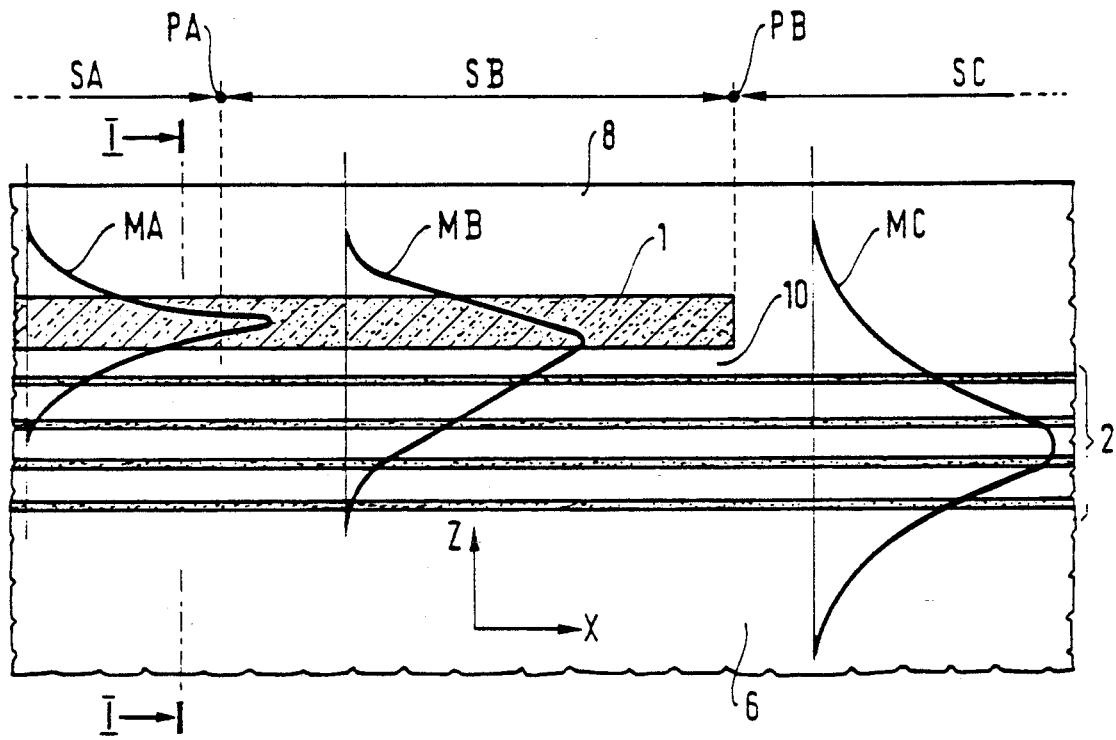
FIG. 2 shows this first laser in partial cross-section on a longitudinal plane II—II in FIG. 1.
Figure 3:
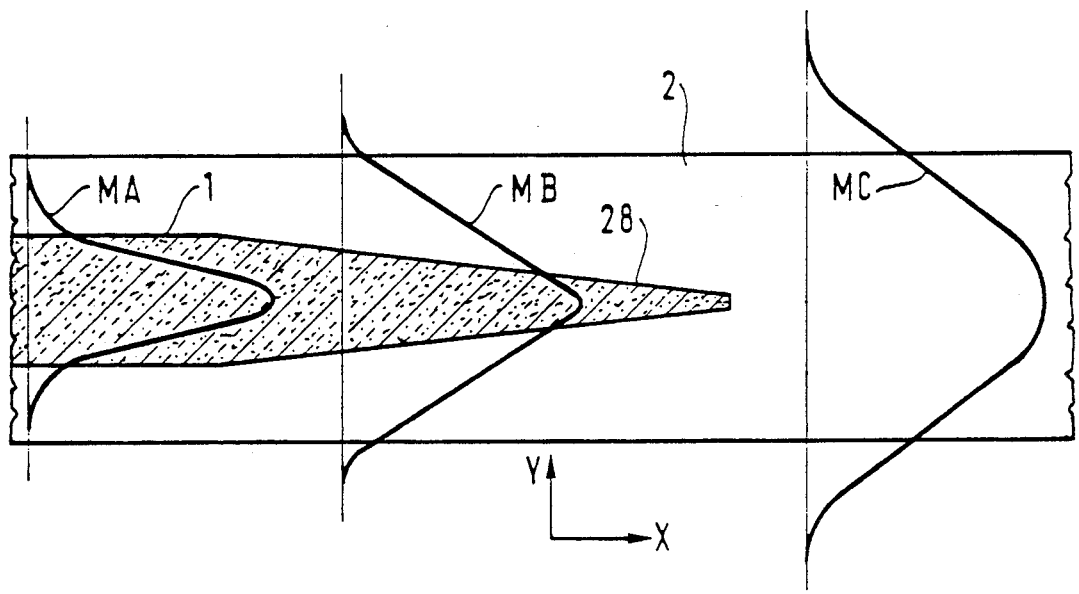
FIG. 3 shows the first laser in partial cross-section on a horizontal plane III—III in FIG. 1.

FIGS. 8 and 9 show in the same way as FIGS. 2 and 3 respectively the distribution of luminous energy in the modes guided by the waveguides 101 and 102.

Said narrow mode is represented at NA, a first intermediate distribution at NB, said wide mode at NC, a second intermediate distribution at ND and said circular mode at NE.

The advantages of the arrangements adopted in this second laser emerge from the following considerations:

The objective to be achieved is to reduce the angular divergence of the optical beam emitted by a semiconductor laser so as to facilitate the injection of the beam into an external guide in the form of an optical fiber. The optimum injection conditions are obtained when the mode guided in the laser is identical at the outlet from the laser to that which can be guided in the external waveguide.

The diameter of the guided mode in a semiconductor laser is in the order of one micron to achieve efficient light/carrier interaction. The diameter of the mode guided by an optical fiber is standardized at ten microns to minimize propagation losses in the fiber and to facilitate connections. The arrangements adopted in the second laser enable the propagation mode of the light to be expanded adiabatically from the optical waveguide to obtain a mode of sufficient mode size and of substantially circular shape at the transition terminal point QC. Immediately in front of the rear transition TB, the mode guided in the waveguide 102 must be almost all confined, in the horizontal plane, in this waveguide in order to constitute a guide load as large as possible for guiding the light, allowing for the thickness of the waveguide. To achieve this result, in other words to enable the luminous power of the mode to move from the waveguide 101 to the waveguide 102 despite the lower refractive index of the latter, the width of the waveguide 102 must be substantially greater than that of the waveguide 101. It follows that the mode specific to the waveguide 102 is necessarily strongly flattened, its vertical mode size being less than its horizontal mode size by a factor of 2.

At this stage the mode size increase is insufficient, especially in the vertical plane, to achieve the required quality of coupling at the laser output. This insufficiency results from the thickness and from the index which are imposed on the waveguide 102 to cause the mode to move towards this guide.

This is why, in accordance with the present invention, the waveguide 102 is extended beyond the rear transition with its width progressively decreasing to circularize and then expand the mode which it guides. Its reduced width must be less than the mode size of the guided mode, in this example by a factor of 2.

The expansion and circularization of the mode which it guides are explained by the fact that reducing the width of the waveguide sufficiently causes loss of confinement of the mode in the horizontal plane. Under these conditions the distribution of the mode in the vertical plane becomes highly dependent on its confinement in the horizontal plane. The distributions of the mode in the vertical and horizontal planes become highly interdependent, the guidance regime being characterized as "weak". This situation contrasts with that in which the waveguide is sufficiently wide for its width to be regarded as infinite relative to its thickness. In this latter situation the horizontal and vertical distributions of the mode are independent and the guidance regime is characterized as "strongly lateral".

The transition must be distributed over a length sufficient to avoid losses by radiation.

An analogous result could be obtained with a single transition like that of the first laser described by way of example. For this, however, the length of the transition would have to be equal to the total length of the two transitions described above. The implementation of the laser would then be very difficult because of the very small angles that would be required at the edges of the active waveguide. The operation of the laser would be randomized because it would not be possible to optimize separately the transition from the waveguide 1 to the waveguide 2 and the circularization of the mode. On the other hand, the limitation of the expansion of the mode in the first transition of the second laser in accordance with this invention makes it possible to confer an increased guide load on the passive waveguide 102 given the fact that the final width of the active waveguide 101 at its end QB must be small enough to confer on the guide at this point a guide load which is negligible in comparison with that of the passive waveguide 102. This increase in the guide load at the waveguide 102 avoids the necessity of making the final width of active waveguide 101 too small to be easily and efficiently implemented. Manufacturing tolerances in respect of the terminal dimensions of the point formed by the waveguide 101 are therefore relaxed. The sensitivity of the mode to imperfections of the edges of the waveguide 101 is also reduced. This enables more reproducible operation of the laser.

The present invention also allows much greater tolerance (a few micrometers) in respect of the positioning of the fiber relative to the component than known lasers. It therefore enables the implementation of optical heads used as optical sources in fiber optic telecommunication networks to be simplified.

Some of the above disclosure applies equally to the addition of active optical components to another type of semiconductor component (hybrid implementation on silicon) posing the same types of problem.

The present invention may also find an application in the implementation of buried stripe non-resonant semiconductor optical amplifiers which are relatively insensitive to the polarization of the guided mode. The small mode size of the guided mode in the active waveguide favors low sensitivity of the gain to the polarization of the mode while the large mode size of the mode in the passive waveguide favors reduction of the reflectivity of the end face (cleaved face) of the component if the normal to this face is offset relative to the waveguide axis.

Figure 4:
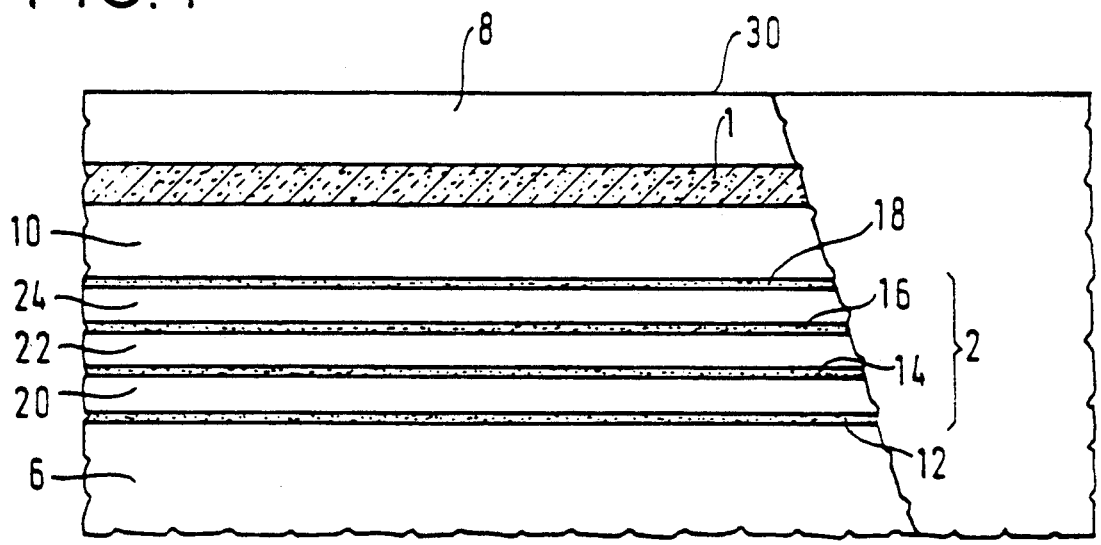
FIGS. 4, 5 and 6 show the first laser in cross-section on the transverse plane I—I at successive stages in the fabrication of the laser.

The fabrication of the first laser described above will now be generally described:

A first epitaxial growth operation (FIG. 4) forms a vertical succession of initial layers which will constitute said functional layers 6, 2, 10, 1, 8 after transverse delimitation of the active waveguide 1 and the passive waveguide 2 and which are respectively designated by the same reference numbers.

The usual epitaxial growth techniques (Molecular Beam Epitaxy (MBE), Metal-Organic Chemical Vapor Deposition (MOCVD), etc) may be used. The waveguide 2 may comprise a thin film or, as previously described, a stack of index increasing transparent very thin films 12, 14, 16, 18 separated by an index decreasing material identical to that of the substrate (diluted wells). The separation between and the number of index increasing layers enables precise control of the mean refractive index of the waveguide 2.

A first etching operation is carried out from an at least temporary upper face 30 of the wafer which is on the same side as said upper confinement layer 8. This operation continues into the thickness of the separation layer 10. Its objective is to delimit the active waveguide 1 transversely. The presence of the separation layer 10 facilitates this operation.

Figure 6:
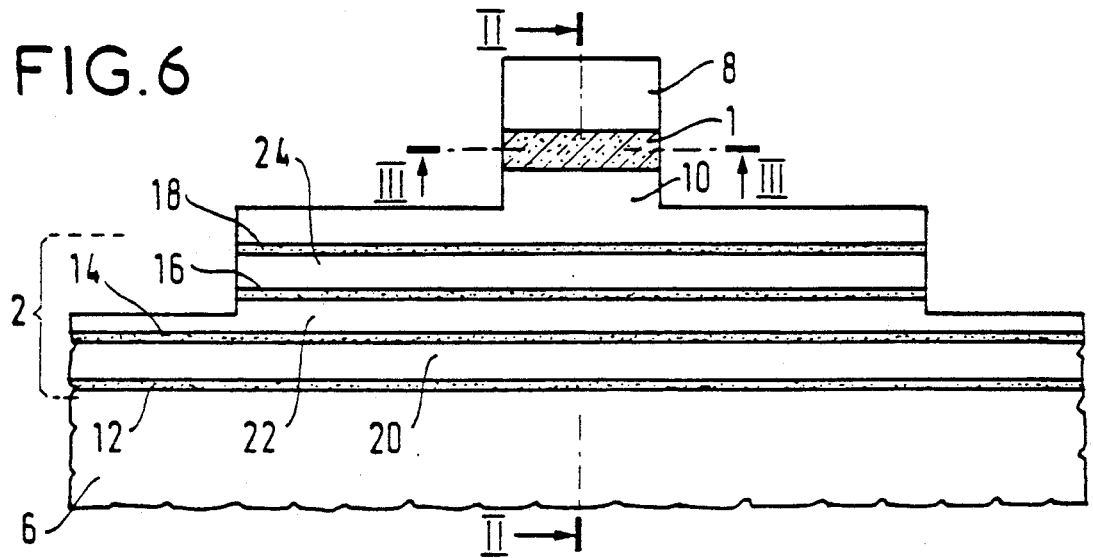
Figure 7:
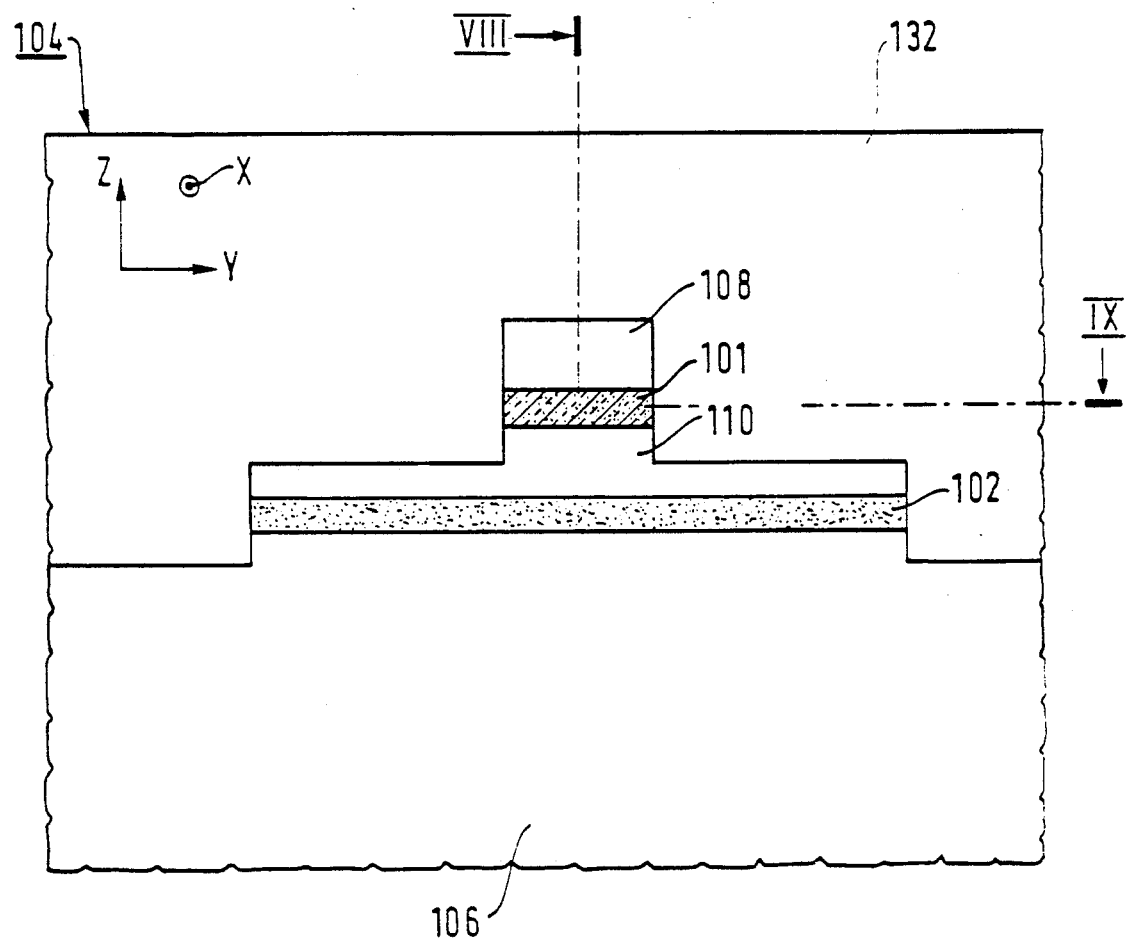
FIG. 7 shows a second laser in accordance with the invention in cross-section on a transverse plane.

A second etching operation penetrates deeper into the thickness of the initial layer 2 to delimit the passive waveguide 2 transversely. This operation is facilitated by the fact that the width of the waveguide 2 is greater than that of the waveguide 1 (FIG. 6). The etch depth controls the transverse index step and ensures propagation of only one mode.

Figure 5:
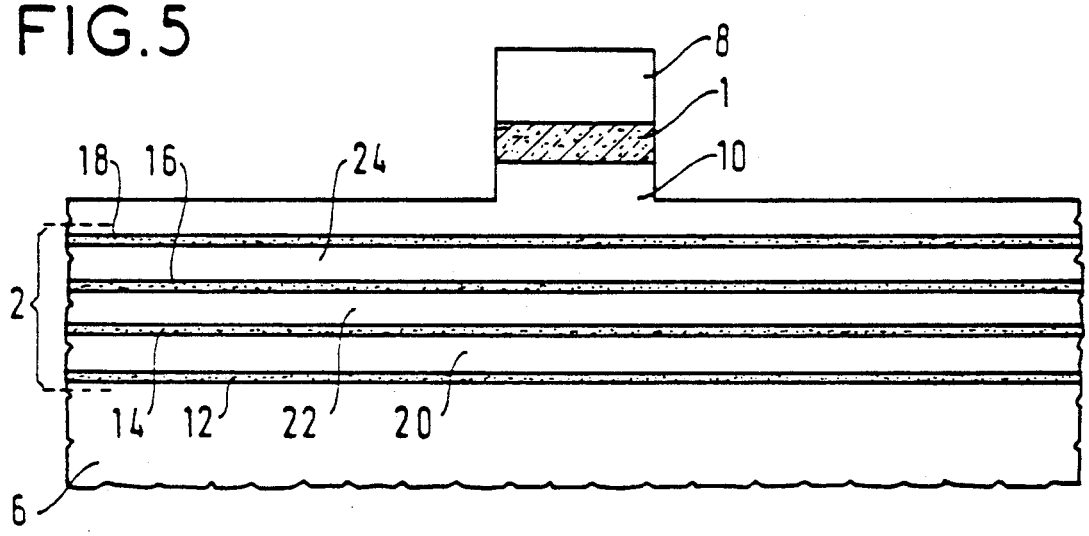

These two etching operations are carried out using appropriate conventional masking techniques (FIG. 5).

A second, preferably epitaxial growth operation then buries the waveguides, the separation layer 10 and the upper confinement layer 8 in the complementary material 32 to complete the wafer 4. This growth may be selective or unselective (FIG. 1).

The second laser described by way of example may be fabricated by the same sequence of operations but the shapes of the masks used for the etching operations must be modified. The parameters of the epitaxial growth operations may also have to be modified.

What is claimed:

1. A widened output mode semiconductor optical component comprising a semiconductor wafer having:
   mutually perpendicular longitudinal, transverse and vertical directions,
   horizontal planes containing said longitudinal and transverse directions,
   and transverse planes perpendicular to said longitudinal direction,
   lengths, widths, thicknesses and transverse cross-section areas of internal elements of said wafer being measured in said longitudinal, transverse and vertical directions and in said transverse planes, respectively, said wafer comprising longitudinal sectional in longitudinal succession in a rear to front direction, said longitudinal sections constituting at least one processing section and one transition section, said transition section starting at a transition initial point in the vicinity of said processing section and ending at a transition final point at a distance from said processing section, said transition section having a rear part between said transition initial point and a wide mode point and further having a front part between said wide mode point and said transition final point, said wafer further comprising a vertical succession of horizontal functional layers which constitute at least:
   a lower confinement layer having a first conductivity type,
   a longitudinal passive waveguide flanked int he transverse direction by a complementary material and having an increased refractive index to guide light, said index, a normal width and a thickness of said waveguide being chosen to guide said light in a single "wide" mode at said wide mode point, the width of said passive waveguide decreasing towards the front in said front part of said transition section so as to couple said wide mode to a circular mode having a greater mode size than said wide mode,
   a longitudinal active waveguide flanked transversely by a complementary material and comprising an active material which has an increased refractive index to guide said light and which is adapted to process said light by amplification, modulation or detection of said light by virtue of interaction with opposite type charge carriers, said passive and active waveguides being superposed and having widths, thicknesses, refractive indices and a mutual spacing chosen to obtain mutual optical coupling between said waveguides and so that light is guided by the combination of said waveguides in said processing section in a single mode which concentrates the energy of said light in said active waveguide and which favors its processing, said single mode constituting a narrow mode one mode size of which is smaller than that of said wide mode, said width of said active waveguide in said processing section defining a processing width, said active waveguide having in said mode transition section and starting from said transition initial point a width which decreases towards the front from said processing width so that light guided in the vicinity of said transition initial point in said narrow mode is guided by said passive waveguide in said wide mode at said wide mode point, and
   an upper confinement layer having a second conductivity type opposite the first type to enable displacement of said opposite type charge carriers in the vicinity of said active waveguide into said processing section, said increased refractive indices being greater than the refractive indices of said lower and upper confinement layers and said complementary materials.

2. Component according to claim 1 wherein said passive waveguide has at said transition initial point a normal width greater than and a mean refractive index less than the width and the refractive index of said active waveguide in said processing section, respectively.

3. Component according to claim 2 wherein a separation layer is disposed between said active and passive waveguides and has a refractive index lower than the mean refractive index of each of said waveguides.

4. Method of fabricating a component according to claim 3 wherein the fabrication of said wafer comprises the following operations:
   a first epitaxial growth operation to form a vertical succession of initial layers that will respectively constitute said functional layers after transverse delimitation of said active and passive waveguides,
   a first etching operation from an at least temporary upper face of said wafer on the same side as said upper confinement layer into the thickness of said separation layer to delimit said active waveguide transversely,
   a second etching operation penetrating more deeply at least to the thickness of said initial layer that will constitute said passive waveguide to delimit said passive waveguide transversely,
   and a second growth operation to bury said waveguides and said separation and upper confinement layers in a complementary material which completes said wafer.

5. Component according to claim 1 wherein said wide mode point constitutes one end of said active waveguide.

6. Component according to claim 5 wherein said active waveguide has in said transition section, projected in a horizontal plane, the general shape of an arrow head with a pointed end thereof cut off.

7. Component according to claim 1 wherein said wide mode has transverse and vertical mode sizes 200% greater than transverse and vertical mode sizes of said narrow mode, said mode sizes of each of said modes being the transverse and vertical dimensions of the area in which the electric field of said mode is attenuated by a ratio less than 2.718 relative to the maximal electric field of said mode, respectively.

8. Component according to claim 7 wherein said wide mode has transverse and vertical mode sizes 400% greater than transverse and vertical mode sizes of said narrow mode, respectively.

9. Component according to claim 8 wherein said circular mode has horizontal and vertical mode sizes increased relative to those of said wide mode, said vertical mode size being increased by a greater ratio than said horizontal mode size.

10. Component according to claim 9 wherein the width of said passive waveguide in said front part of said transition section is first equal to a normal passive waveguide width as far as said wide mode point and then decreases progressively to said transition final point at which it becomes equal to a reduced passive waveguide width, the thickness of said passive waveguide being constant, and said active waveguide being absent.

11. Component according to claim 10 wherein said reduced passive waveguide width is 60% less than said normal passive waveguide width.

12. Component according to claim 10 further comprising a coupling section which extends towards the front from said transition final point and wherein the width of said passive waveguide remains equal to said reduced width.

* * * * *